United States Patent
Furuyama (10) Patent No.: US 10,557,614 B2
(45) Date of Patent: Feb. 11, 2020

(54) PROJECTOR LIGHT SOURCE INCLUDING WAVELENGTH CONVERSION MEMBER HAVING POROUS CERAMIC SUBSTRATE

(71) Applicant: NIPPON ELECTRIC GLASS CO., LTD., Otsu-shi, Shiga (JP)

(72) Inventor: Tadahito Furuyama, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 313 days.

(21) Appl. No.: 15/539,724

(22) PCT Filed: Jan. 22, 2016

(86) PCT No.: PCT/JP2016/051903
§ 371 (c)(1),
(2) Date: Jun. 26, 2017

(87) PCT Pub. No.: WO2016/125611
PCT Pub. Date: Aug. 11, 2016

(65) Prior Publication Data
US 2018/0003363 A1  Jan. 4, 2018

(30) Foreign Application Priority Data

Feb. 3, 2015  (JP) ................................. 2015-018967
Mar. 24, 2015  (JP) ................................. 2015-060499

(51) Int. Cl.
*F21V 9/32*  (2018.01)
*F21V 9/30*  (2018.01)
(Continued)

(52) U.S. Cl.
CPC ................. *F21V 9/30* (2018.02); *C04B 41/85* (2013.01); *F21V 7/22* (2013.01); *F21V 9/40* (2018.02);
(Continued)

(58) Field of Classification Search
CPC ... H01L 33/50; F21K 9/64; F21V 9/32; H05B 33/14; H05B 33/20
See application file for complete search history.

(56) References Cited

U.S. PATENT DOCUMENTS 8,556,437 B2 *  10/2013  Miyake ..................... F21V 7/22
                                                        362/84
8,872,208 B2 *  10/2014  Kawakami ................ G02F 1/00
                                                        257/98
(Continued)

FOREIGN PATENT DOCUMENTS

JP    2003-297551 A    10/2003
JP    2006-287132 A    10/2006
(Continued)

OTHER PUBLICATIONS

Official Communication issued in International Patent Application No. PCT/JP2016/051903, dated Apr. 5, 2016.

*Primary Examiner* — Ismael Negron
(74) *Attorney, Agent, or Firm* — Keating and Bennett, LLP (57) ABSTRACT

A wheel-shaped wavelength conversion member includes a first porous ceramic layer having a porosity of at least 20% by volume, a phosphor layer formed on a first principal surface of the first porous ceramic layer, a ceramic heat dissipation layer having a porosity of 20% or less by volume provided on a second principal surface of the first porous ceramic layer opposite the first principal surface, and a second porous ceramic layer having a porosity of at least 20% by volume provided on a surface of the heat dissipation layer opposite the first porous ceramic layer.

14 Claims, 7 Drawing Sheets

(a)

(b)

(51) Int. Cl.

| | | |
|---|---|---|
| *F21V 9/40* | (2018.01) | |
| *C04B 41/85* | (2006.01) | |
| *F21V 7/22* | (2018.01) | |
| *G03B 21/20* | (2006.01) | |
| *G03B 21/00* | (2006.01) | |
| *G02B 26/00* | (2006.01) | |
| *G03B 21/16* | (2006.01) | |
| *H04N 9/31* | (2006.01) | |
| *H01L 33/64* | (2010.01) | |
| *H01L 33/50* | (2010.01) | |
| *H01S 5/00* | (2006.01) | |

(52) U.S. Cl.
CPC ........... *G02B 26/008* (2013.01); *G03B 21/00* (2013.01); *G03B 21/16* (2013.01); *G03B 21/204* (2013.01); *H01L 33/647* (2013.01); *H04N 9/3144* (2013.01); *H04N 9/3158* (2013.01); *H01L 33/50* (2013.01); *H01S 5/005* (2013.01)

(56) References Cited

U.S. PATENT DOCUMENTS

| | | | | |
|---|---|---|---|---|
| 9,156,209 | B2 * | 10/2015 | Riebel | B01D 53/8668 |
| 10,001,261 | B2 * | 6/2018 | Yagyu | H04N 9/3158 |
| 10,146,045 | B2 * | 12/2018 | Li | H05B 33/10 |
| 10,281,808 | B2 * | 5/2019 | Hsu | G02B 26/008 |
| 10,288,872 | B2 * | 5/2019 | Li | G02B 26/008 |
| 2005/0156519 | A1 | 7/2005 | Yoshizawa et al. | |
| 2009/0122273 | A1 * | 5/2009 | Menard | G02B 26/008 |
| | | | | 353/84 |
| 2009/0187234 | A1 * | 7/2009 | Meyer | C09K 11/06 |
| | | | | 607/88 |
| 2009/0213591 | A1 | 8/2009 | Katabe et al. | |
| 2011/0116253 | A1 * | 5/2011 | Sugiyama | F21S 10/007 |
| | | | | 362/84 |
| 2013/0088689 | A1 * | 4/2013 | Lin | G03B 21/204 |
| | | | | 353/31 |
| 2013/0257264 | A1 | 10/2013 | Tamaki et al. | |
| 2014/0254133 | A1 * | 9/2014 | Kotter | C09K 11/02 |
| | | | | 362/84 |
| 2015/0153487 | A1 * | 6/2015 | Hua | G02B 5/0875 |
| | | | | 359/871 |
| 2015/0159836 | A1 | 6/2015 | Tamaki et al. | |

FOREIGN PATENT DOCUMENTS

| | | |
|---|---|---|
| JP | 2011-191785 A | 9/2011 |
| JP | 2012-227224 A | 11/2012 |
| JP | 2012-227363 A | 11/2012 |
| JP | 2013-207049 A | 10/2013 |
| JP | 2013-247067 A | 12/2013 |
| JP | 2014-119492 A | 6/2014 |
| JP | 2014-229503 A | 12/2014 |
| JP | 2015-001709 A | 1/2015 |

* cited by examiner

PROJECTOR LIGHT SOURCE INCLUDING WAVELENGTH CONVERSION MEMBER HAVING POROUS CERAMIC SUBSTRATE

TECHNICAL FIELD

The present invention relates to wavelength conversion members suitable as luminescent wheels for projectors or the like and light emitting devices using the same.

BACKGROUND ART

To reduce projector size, there have recently been proposed light emitting devices in which a light source, such as an LED (light emitting diode), and a phosphor are used. For example, there is proposed a so-called reflective luminescent wheel in which light from a light source is converted in wavelength to fluorescence by a phosphor layer and the resultant fluorescence is reflected, by a reflective layer provided adjacent to a wavelength conversion member, toward the side through which the light from the light source has entered the phosphor layer, thus extracting the reflected light to the outside (see, for example, Patent Literature 1). The reflective luminescent wheel has the advantage of having a high efficiency of fluorescence extraction to the outside and therefore easily giving a high intensity to a projector.

Patent Literature 1 discloses, as the reflective layer, a metal layer made of gold, silver, copper, aluminum or others. Because the metal layer also has a high thermal conductivity and, therefore, can efficiently release heat generated in the phosphor layer to the outside, it has the advantage of effectively reducing temperature quenching of the phosphor (the phenomenon that the luminescence intensity decreases with increasing temperature of the phosphor).

CITATION LIST

Patent Literature

[PTL 1]
JP-A-2015-1709

SUMMARY OF INVENTION

Technical Problem

Because the metal layer has a relatively high coefficient of thermal expansion, its rate of expansion and contraction is large when it is irradiated with light from the light source or when the light irradiation stops. Therefore, owing to a difference in coefficient of thermal expansion of the metal layer from the phosphor layer, the phosphor layer may crack or peel off from the metal layer. To cope with this, it is conceivable to use as a reflective layer a ceramic layer having a relatively small coefficient of thermal expansion and a relatively high thermal conductivity. However, the ceramic layer has the problem that it has a lower reflectance and therefore cannot provide sufficient luminescence intensity.

In view of the foregoing, a technical challenge for the present invention is to provide a wavelength conversion member including a ceramic layer as a reflective layer and having excellent luminescence intensity and a light emitting device using the same.

Solution to Problem

A wavelength conversion member according to the present invention includes: a first porous ceramic layer having a porosity of 20% by volume or more; and a phosphor layer formed on a principal surface of the first porous ceramic layer.

In the wavelength conversion member according to the present invention, the first porous ceramic layer functions as a reflective layer. Specifically, fluorescence produced by irradiating a principal surface of the phosphor layer (a principal surface thereof on the side opposite to the first porous ceramic layer) with excitation light is reflected by the first porous ceramic layer and emitted to the outside through the same principal surface of the phosphor layer as the principal surface through which the excitation light has entered the phosphor layer. In doing so, the first porous ceramic layer exhibits a high optical reflectance since it has a porosity of 20% by volume or more. Specifically, at the interface between each pore and the ceramic present inside the first porous ceramic layer, light is likely to be reflected owing to a refractive index difference between them. Since in the present invention the percentage of pores in the first porous ceramic layer is as large as 20% by volume or more and, therefore, there are a large number of interfaces contributing to light reflection, the optical reflectance of the entire first porous ceramic layer becomes high. As a result, fluorescence produced in the phosphor layer can be efficiently reflected by the first porous ceramic layer, so that the luminescence intensity of the wavelength conversion member can be increased. Furthermore, heat generated in the phosphor layer is released through the first porous ceramic layer.

In the wavelength conversion member according to the present invention, the phosphor layer is preferably bonded to the first porous ceramic layer by fusion bonding or through an inorganic bonding layer.

With the above structure, the phosphor layer and the first porous ceramic layer can be bonded together without the use of a resin adhesive or the like having low thermal resistance, so that a wavelength conversion member having excellent thermal resistance can be obtained. Specifically, whereas resin adhesives are degraded and blackened by heat due to irradiation of excitation light and are therefore likely to decrease the luminescence intensity with time, this problem is less likely to occur in the above structure. Furthermore, the resin adhesives have low thermal conductivity. Therefore, when the phosphor layer and the first porous ceramic layer are bonded by such a resin adhesive, heat generated in the phosphor layer is less likely to be released to the first porous ceramic layer side. In contrast, when the phosphor layer is bonded to the first porous ceramic layer by fusion bonding or through an inorganic bonding layer, heat generated in the phosphor layer is likely to be efficiently released to the first porous ceramic layer side.

In In the wavelength conversion member according to the present invention, the first porous ceramic layer is preferably made of at least one selected from aluminum oxide, magnesium oxide, and zirconium oxide.

In the wavelength conversion member according to the present invention, a heat dissipation layer is preferably formed on a principal surface of the first porous ceramic layer located on a side opposite to the principal surface thereof on which the phosphor layer is formed.

Heat generated in the phosphor layer is transferred to the first porous ceramic layer. However, since the first porous ceramic layer has a large number of pores, its thermal conductivity may be insufficient. When in this situation the above structure is employed, heat generated in the phosphor layer and transferred to the first ceramic layer becomes likely to be released through the heat dissipation layer to the outside. Thus, heat build-up in the phosphor layer can be further reduced.

In the wavelength conversion member according to the present invention, the heat dissipation layer is preferably a dense ceramic layer having a porosity of below 20% by volume.

Since the percentage of pores having thermal insulation properties in the dense ceramic layer is as low as below 20% by volume, the dense ceramic layer has relatively good thermal conductivity. Furthermore, because light having passed through the first porous ceramic layer without being reflected by it can be reflected by the dense ceramic layer, the optical reflectance of the entire wavelength conversion member can be increased.

In the wavelength conversion member according to the present invention, the dense ceramic layer is preferably made of at least one selected from aluminum oxide, magnesium oxide, and zirconium oxide.

In the wavelength conversion member according to the present invention, a second porous ceramic layer having a porosity of 20% by volume or more is preferably formed on a principal surface of the heat dissipation layer located on a side opposite to a principal surface thereof on which the first porous ceramic layer is formed.

As will be described hereinafter, the first porous ceramic layer is produced, for example, by firing a green sheet which is a raw material. In this relation, the green sheet is likely to be contracted by firing, so that a laminate including the first porous ceramic layer and the heat dissipation layer may warp. Particularly when the thickness of each layer is small, warpage is likely to occur. To cope with this, a second porous ceramic layer having a porosity of 20% by volume or more is formed on a principal surface of the heat dissipation layer located on the side opposite to a principal surface thereof on which the first porous ceramic layer is formed. Thus, the stress generated between the heat dissipation layer and the first ceramic layer is balanced with the stress generated between the heat dissipation layer and the second ceramic layer, so that warpage becomes less likely to occur during firing.

In the wavelength conversion member according to the present invention, the first porous ceramic layer and the second porous ceramic layer are preferably identical in porosity, thickness and/or material. With this structure, the problem of warpage can be effectively reduced which may occur in the process of firing the green sheet during production of the wavelength conversion member according to the present invention.

In the wavelength conversion member according to the present invention, the first porous ceramic layer and/or the second porous ceramic layer preferably contain easily sinterable ceramic powder. Thus, the transverse rupture strength of the first porous ceramic layer and/or second porous ceramic layer can be increased, resulting in increased transverse rupture strength of the entire wavelength conversion member.

In the wavelength conversion member according to the present invention, the first porous ceramic layer and/or the second porous ceramic layer preferably have a content of easily sinterable ceramic powder of 0.1 to 50% by volume.

In the wavelength conversion member according to the present invention, the phosphor layer is preferably formed of a phosphor dispersed in an inorganic binder. Thus, the thermal resistance of the phosphor layer can be easily increased, so that the phosphor layer becomes less likely to cause defects, such as breakage due to irradiation of excitation light.

The wavelength conversion member according to the present invention may have a wheel shape. In this case, the wavelength conversion member is suitable as a component of a light source for a projector.

A light emitting device according to the present invention includes: the above-described wavelength conversion member; and a light source capable of irradiating the phosphor layer of the wavelength conversion member with excitation light.

The light emitting device according to the present invention can be used as a light source for a projector.

Advantageous Effects of Invention

The present invention enables to provide a wavelength conversion member including a ceramic layer as a reflective layer and having excellent luminescence intensity and a light emitting device using the same.

BRIEF DESCRIPTION OF DRAWINGS

FIG. 8(a) is a plan view showing a wavelength conversion member according to an eighth embodiment of the present invention and FIG. 8 (b) is a cross-sectional view taken along the line A-A' in FIG. 8 (a).

FIG. 9 (a) is a plan view showing a wavelength conversion member according to a ninth embodiment of the present invention and FIG. 9 (b) is a cross-sectional view taken along the line A-A' in FIG. 9(a).

FIG. 10(a) is a plan view showing a wavelength conversion member according to a tenth embodiment of the present invention, FIG. 10 (b) is a cross-sectional view taken along the line A-A' in FIG. 10 (a), and FIG. 10 (c) is a plan view of a heat dissipation layer in FIG. 10 (a).

DESCRIPTION OF EMBODIMENTS

Hereinafter, embodiments of a wavelength conversion member according to the present invention will be described with reference to the drawings. However, the following embodiments are simply illustrative and the present invention is not intended to be limited to the following embodiments. In the drawings, elements having substantially the same functions may be referred to by the common references.

(1) Wavelength Conversion Member According to First Embodiment

Figure 1:
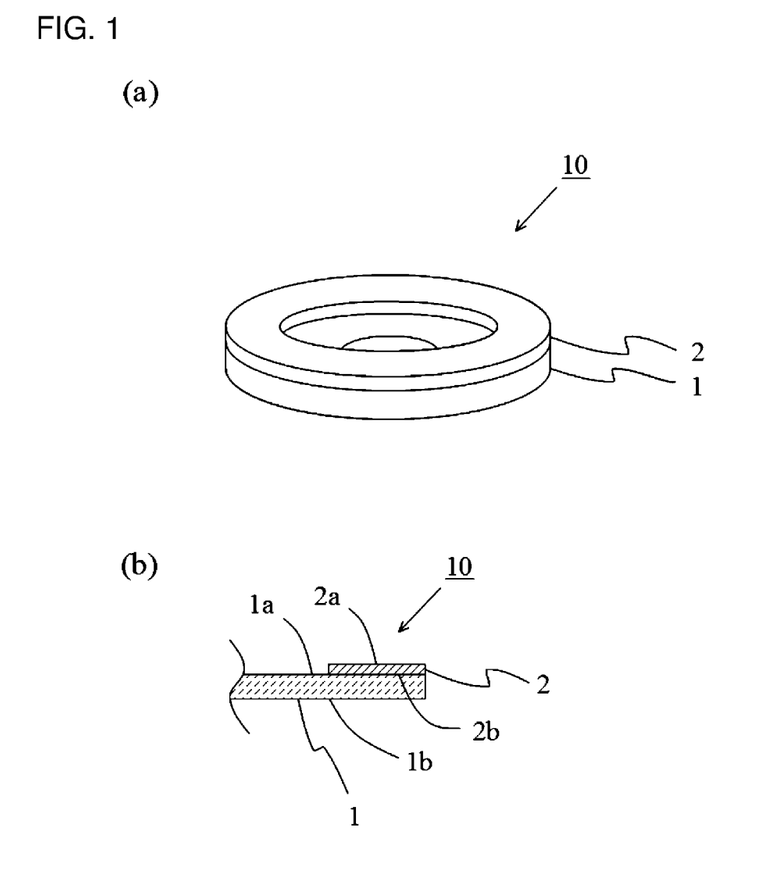
FIG. 1(a) is a schematic perspective view showing a wavelength conversion member according to a first embodiment of the present invention and FIG. 1(b) is a view showing part of a side section of the wavelength conversion member shown in FIG. 1(a).

FIG. 1(a) is a schematic perspective view showing a wavelength conversion member according to a first embodiment of the present invention and FIG. 1(b) is a view showing part of a side section of the wavelength conversion member shown in FIG. 1(a).

A wavelength conversion member 10 has the shape of a wheel including: a first porous ceramic layer 1 having the shape of a ring; and a phosphor layer 2 having the shape of a ring formed on a principal surface of the first porous ceramic layer 1 to have substantially the same outside diameter and the same center as the first porous ceramic layer 1. Specifically, the first porous ceramic layer 1 has a principal surface 1a and a principal surface 1b and a phosphor layer 2 is formed on the principal surface 1a. Excitation light enters the phosphor layer 2 through a principal surface 2a thereof and is converted in wavelength by a phosphor contained in the phosphor layer 2 to produce fluorescence. The fluorescence is reflected by the first porous ceramic layer 1 and emitted to the outside through the principal surface 2a of the phosphor layer 2. In this relation, the first porous ceramic layer 1 preferably has a higher thermal conductivity than the phosphor layer 2, so that heat generated in the phosphor layer 2 becomes likely to be efficiently released to the outside.

The first porous ceramic layer 1 has a porosity of 20% by volume or more, preferably 30% by volume or more, and particularly preferably 40% by volume or more. Since the first porous ceramic layer 1 has a porosity of 20% by volume or more, it exhibits a high optical reflectance for the reason described previously. The upper limit of the porosity of the first porous ceramic layer 1 is preferably not more than 80% by volume, more preferably not more than 75% by volume, and particularly preferably not more than 70% by volume. If the porosity of the first porous ceramic layer 1 is too high, the mechanical strength may decrease or the thermal conductivity may decrease to make it less likely that heat generated in the phosphor layer 2 is released to the outside.

Examples of the first porous ceramic layer 1 that can be cited include those made of aluminum oxide, magnesium oxide, zirconium oxide, titanium oxide, niobium oxide, zinc oxide, silicon oxide, yttrium oxide, aluminum nitride, boron nitride, silicon nitride, silicon carbide or other ceramics. These ceramics may be used alone or in combination of two or more. Preferred among them are aluminum oxide, magnesium oxide, and zirconium oxide because they are highly thermally conductive and inexpensive. Particularly preferred is aluminum oxide. The material forming the first porous ceramic layer preferably has a higher thermal conductivity than the phosphor layer 2.

The first porous ceramic layer 1 preferably contains easily sinterable ceramic powder. Thus, the transverse rupture strength of the first porous ceramic layer can be increased, resulting in increased transverse rupture strength of the entire wavelength conversion member.

The easily sinterable ceramic powder is ceramic powder sinterable at low temperatures. The easily sinterable ceramic powder is decreased in sintering temperature by increasing the purity or decreasing the particle diameter. Specifically, the easily sinterable ceramic powder can be sintered even by firing it at relatively low temperatures, for example, 1100 to 1500° C. or even 1200 to 1400° C.

The average particle diameter ($D_{50}$) of the easily sinterable ceramic powder is preferably 0.01 to 10 µm, particularly 0.05 to 5 µm, and particularly preferably 0.08 to 1 µm. By allowing the average particle diameter to fall within the above range, the easily sinterable ceramic powder can be sintered at relatively low temperatures.

The purity of the easily sinterable ceramic powder is preferably 99% or more, more preferably 99.9% or more, and particularly preferably 99.99% or more. By allowing the purity of the easily sinterable ceramic powder to fall within the above range, the easily sinterable ceramic powder can be sintered at relatively low temperatures.

Examples of the easily sinterable ceramic powder that can be cited include easily sinterable alumina powder and easily sinterable zirconia powder. Preferred among them is easily sinterable alumina powder because it has excellent sinterability at low temperatures. Examples of the easily sinterable alumina powder that can be used include AL-160SG series manufactured by Showa Denko K.K. and Taimicron TM-D series manufactured by Taimei Chemicals Co., Ltd.

The content of the easily sinterable ceramic powder in the first porous ceramic layer is, in % by volume, preferably 0.1 to 50%, more preferably 1 to 40%, and particularly preferably 5 to 30%. If the content of the easily sinterable ceramic powder is too small, the above effect becomes less likely to be achieved. On the other hand, if the content of the easily sinterable ceramic powder is too large, the porosity decreases, so that the optical reflectance becomes likely to decrease.

The thickness of the first porous ceramic layer 1 is preferably 0.05 to 2 mm, more preferably 0.1 to 1.5 mm, and particularly preferably 0.2 to 1 mm. If the thickness of the first porous ceramic layer 1 is too small, the mechanical strength decreases, so that the first porous ceramic layer 1 is likely to become broken during use. In addition, a sufficient optical reflectance becomes less likely to be achieved. On the other hand, if the thickness of the first porous ceramic layer 1 is too large, the mass of the wavelength conversion member 10 and thus the light emitting device using the same is liable to be large. In addition, when the wheel-shaped wavelength conversion member 10 is used as a light source for a projector, the load on a motor for rotating the wavelength conversion member 10 may become large or vibrations resulting from the rotation of the motor may become large to break the wavelength conversion member 10.

An example of the phosphor layer 2 that can be cited is one formed of a phosphor dispersed in an inorganic binder. An example of the inorganic binder that can be cited is glass. Thus, the phosphor layer 2 becomes likely to match in coefficient of thermal expansion with the first porous ceramic layer 1, so that even if it reaches a high temperature by irradiation of excitation light, breakage due to a difference in coefficient of thermal expansion becomes less likely to occur.

Examples of the glass that can be used as the inorganic binder include borosilicate-based glasses and phosphate-based glasses. The softening point of the glass is preferably 250 to 1000° C. and particularly preferably 300 to 850° C. If the softening point of the glass is too low, the mechanical strength of the phosphor layer 2 becomes likely to decrease or the phosphor layer 2 is likely to become melted by irradiation of excitation light. On the other hand, if the softening point of the glass is too high, the phosphor is likely to degrade in the firing process during production, so that the luminescence intensity of the phosphor layer 2 becomes likely to decrease.

No particular limitation is placed on the type of the phosphor so long as it emits fluorescence upon entry of excitation light. Specific examples of the phosphor that can be cited include one or more selected from the group consisting of, for example, oxide phosphor, nitride phosphor, oxynitride phosphor, chloride phosphor, oxychloride phosphor, sulfide phosphor, oxysulfide phosphor, halide phosphor, chalcogenide phosphor, aluminate phosphor, halophosphoric acid chloride phosphor, and garnet-based compound phosphor. When using a blue light as the excitation light, phosphors each capable of emitting, for example, a green light, a yellow light or a red light as fluorescence may be used in a mixture.

The average particle diameter ($D_{50}$) of the phosphor is preferably 1 to 50 μm and particularly preferably 5 to 25 μm. If the average particle diameter of the phosphor is too small, the luminescence intensity becomes likely to decrease. On the other hand, if the average particle diameter of the phosphor is too large, the luminescent color is liable to be uneven.

The content of the phosphor in the phosphor layer 2 is preferably 5 to 80% by volume, more preferably 10 to 75% by volume, and particularly preferably 20 to 70% by volume. If the content of the phosphor is too small, the luminescence intensity is liable to be insufficient. On the other hand, if the content of the phosphor is too large, the mechanical strength of the phosphor layer 2 is liable to be insufficient.

The thickness of the phosphor layer 2 is preferably small in the range that excitation light can be surely absorbed into the phosphor. The reason for this is that if the phosphor layer 2 is too thick, scattering and absorption of light in the phosphor layer 2 may become too much, so that the efficiency of emission of fluorescence may become low. Specifically, the thickness of the phosphor layer 2 is preferably not more than 1 mm, more preferably not more than 0.5 mm, and particularly preferably not more than 0.3 mm. The lower limit of the thickness of the phosphor layer 2 is generally about 0.03 mm.

The phosphor layer 2 is preferably bonded to the first porous ceramic layer 1 by fusion bonding or through an inorganic bonding layer. Thus, the thermal resistance of the wavelength conversion member 10 can be increased. Furthermore, heat generated in the phosphor layer 2 can be efficiently released to the first porous ceramic layer 1 side.

An example of the method for bonding the phosphor layer 2 to the first porous ceramic layer 1 by fusion bonding is a method of laying the phosphor layer 2 on the principal surface 1a of the first porous ceramic layer 1 and applying heat and pressure to them to bond them together, and firing them. For example, in the case of a phosphor layer 2 formed of a phosphor dispersed in a glass matrix, the first porous ceramic layer 1 and the glass matrix in the phosphor layer 2 are bonded by fusion.

An example of the method for bonding the phosphor layer 2 to the first porous ceramic layer 1 through an inorganic bonding layer is a method of applying a transparent inorganic material prepared by a sol-gel method onto the principal surface 1a of the porous ceramic layer 1, laying the phosphor layer 2 on top of the transparent inorganic material, and applying heat to them. An example of the transparent inorganic material prepared by a sol-gel method is polysilazane. Polysilazane reacts with moisture in the air to generate ammonia and become condensed, thus forming a $SiO_2$ coating. As just described, a bonding agent capable of forming an inorganic glass coating at relatively low temperatures (room temperature to 200° C.) can be used as the transparent inorganic material. Other than the above, bonding agents can be used which contain an alcohol-soluble organic silicon compound or other metal compounds (organic or inorganic) and form a $SiO_2$ network, like glass, at relatively low temperatures in the presence of a catalyst. When such a bonding agent is used together with a metal alkoxide as an organometallic compound and an alcohol as a catalyst, hydrolysis and dehydration are promoted, resulting in the formation of a $SiO_2$ network.

The wavelength conversion member 10 can be produced in the following manner.

A slurry containing ceramic powder as a raw material for the first porous ceramic layer 1 and organic compounds, including a binder resin, a solvent, and a plasticizer, is applied onto a resin film made of polyethylene terephthalate or other materials by the doctor blade method or other methods and then dried by the application of heat, thus producing a green sheet for the first porous ceramic layer 1. In this case, the average particle diameter ($D_{50}$) of the ceramic powder, which is a raw material for the first porous ceramic layer 1, is preferably 0.1 to 10 μm. If the average particle diameter of the ceramic powder is too small, the porosity of the first porous ceramic layer 1 becomes likely to decrease. On the other hand, if the average particle diameter of the ceramic powder is too large, sintering becomes insufficient and, therefore, the mechanical strength of the first porous ceramic layer 1 becomes likely to decrease. Next, the green sheet for the first porous ceramic layer 1 is fired at approximately 1200 to 1500° C. In this manner, the first porous ceramic layer 1 is obtained. In doing so, if the firing temperature is too low, sintering is liable to be insufficient. On the other hand, if the firing temperature is too high, the porosity becomes likely to decrease.

Furthermore, a slurry containing glass powder to be a glass matrix for the phosphor layer 2, a phosphor, and organic compounds, including a binder resin, a solvent, and a plasticizer, is applied onto a resin film made of polyethylene terephthalate or other materials by the doctor blade method or other methods and then dried by the application of heat, thus producing a green sheet for the phosphor layer 2.

The obtained green sheets for the porous ceramic layer 1 and the phosphor layer 2 are laid one on top of another and fired, thus obtaining a wavelength conversion member 10 in which the porous ceramic layer 1 and the phosphor layer 2 are bonded by fusion. In doing so, the firing temperature is preferably within a range of ±100° C. from the softening temperature of the glass powder in the phosphor layer 2 and particularly preferably within a range of ±50° C. from the softening point of the glass powder. If the firing temperature is too low, the phosphor layer 2 is less likely to become bonded by fusion to the porous ceramic layer 1. In addition, the sintering of the glass powder becomes insufficient and, therefore, the mechanical strength of the phosphor layer 2 becomes likely to decrease. On the other hand, if the firing temperature is too high, the phosphor may degrade to decrease the luminescence intensity.

Other than the above method, a wavelength conversion member 10 in which the porous ceramic layer 1 and the phosphor layer 2 are bonded by fusion can be obtained by applying a slurry for the phosphor layer 2 on the surface of the porous ceramic layer 1 and firing them. As the slurry for the phosphor layer 2 for use in this case, the slurry used for producing the green sheet for the phosphor layer 2 can be used.

Alternatively, a wavelength conversion member 10 in which the porous ceramic layer 1 and the phosphor layer 2 are bonded together through an inorganic bonding layer can be obtained by separately firing the green sheet for the porous ceramic layer 1 and the green sheet for the phosphor layer 2 to obtain the porous ceramic layer 1 and the phosphor layer 2 and then bonding them together using an inorganic bonding agent.

In each of the above production methods, a degreasing process for removing organic matter may be performed before the firing of the green sheet or the slurry. Furthermore, during laying of the layers including the green sheets, the layers may be appropriately bonded by the application of heat and pressure in order to increase the adhesiveness between them.

(2) Wavelength Conversion Member According to Second Embodiment

Figure 2:
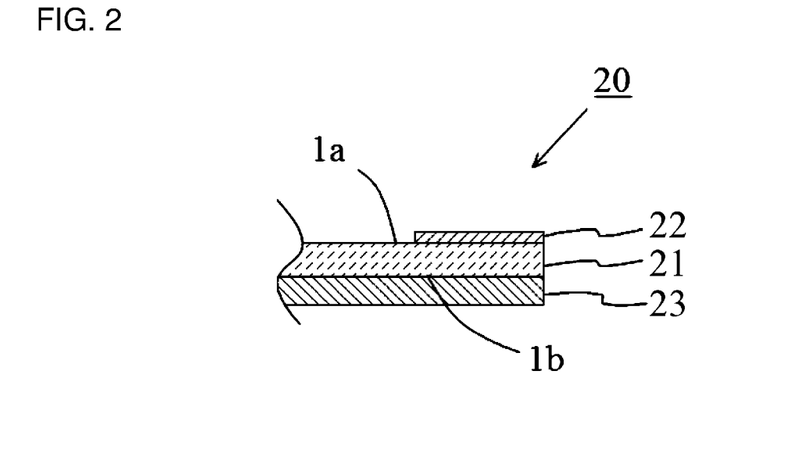
FIG. 2 is a view showing part of a side section of a wavelength conversion member according to a second embodiment of the present invention.

FIG. 2 is a view showing part of a side section of a wavelength conversion member according to a second embodiment of the present invention. A wavelength conversion member 20 according to this embodiment is different from the wavelength conversion member 10 according to the first embodiment in that a heat dissipation layer 23 is provided on the principal surface 1b of the porous ceramic layer 21 located on the opposite side to the principal surface 1a on which the phosphor layer 22 is formed. The heat dissipation layer 23 has the shape of a ring having substantially the same outside diameter and the same center as the first porous ceramic layer 21. The other structures are the same as in the wavelength conversion member 10 according to the first embodiment. By providing the heat dissipation layer 23 on the principal surface 1b of the porous ceramic layer 21, heat generated in the phosphor layer 22 and transferred to the first ceramic layer 21 becomes likely to be released through the heat dissipation layer 23 to the outside for the reason described previously. The thermal conductivity of the heat dissipation layer 23 is preferably 5 W/m·K or more, more preferably 10 W/m·K or more, and particularly preferably 20 W/m·K or more.

An example of the heat dissipation layer 23 that can be cited is a dense ceramic layer. The porosity of the dense ceramic layer is preferably below 20% by volume, more preferably 15% by volume or less, and particularly preferably 10% by volume or less. If the porosity of the dense ceramic layer is too high, the thermal conductivity may decrease, so that the heat dissipation property becomes likely to decrease. On the other hand, the lower limit of the porosity of the dense ceramic layer is not particularly limited but, realistically speaking, not less than 0.2% by volume.

Examples of the dense ceramic layer that can be cited include those made of aluminum oxide, magnesium oxide, zirconium oxide, titanium oxide, niobium oxide, zinc oxide, yttrium oxide, aluminum nitride, boron nitride, silicon carbide or other ceramics. These ceramics may be used alone or in combination of two or more. Preferred among them are aluminum oxide, magnesium oxide, and zirconium oxide because they are highly thermally conductive and inexpensive.

The heat dissipation layer 23 may be made of, other than those above, sapphire or metal, such as aluminum, silver or copper.

The thickness of the heat dissipation layer 23 is preferably 0.2 to 2 mm, more preferably 0.3 to 1.5 mm, and particularly preferably 0.5 to 1 mm. If the thickness of the heat dissipation layer 23 is too small, a sufficient heat dissipation effect becomes less likely to be achieved. On the other hand, if the thickness of the heat dissipation layer 23 is too large, the mass of the wavelength conversion member 20 and thus the light emitting device using the same is liable to be large. In addition, when the wheel-shaped wavelength conversion member 20 is used as a light source for a projector, the load on a motor for rotating the wavelength conversion member 20 may become large or vibrations resulting from the rotation of the motor may become large to break the wavelength conversion member 20.

The wavelength conversion member 20 can be produced in the following manner.

A green sheet for a first porous ceramic layer 21 is produced in the same manner as the method in the wavelength conversion member 10.

Next, a heat dissipation layer 23 is prepared. In the case of using a dense ceramic layer as the heat dissipation layer 23, a green sheet for a dense ceramic layer is obtained in the same manner as the method for producing a green sheet for the porous ceramic layer 1 in the wavelength conversion member 10. The green sheet for a dense ceramic layer is sintered at a relatively high temperature to obtain a low-porosity dense ceramic layer. Specifically, the green sheet for a dense ceramic layer is preferably sintered at approximately 1500° C. or more and preferably at 1600° C. or more. Furthermore, as the average particle diameter ($D_{50}$) of ceramic powder which is a raw material is lower, the porosity of the dense ceramic layer can be more easily decreased.

Subsequently, the green sheet for a first porous ceramic layer 21 and the heat dissipation layer 23 are laid one on top of another and fired to obtain a laminate in which a first porous ceramic layer 21 and the heat dissipation layer 23 are bonded together.

In the same manner as the method in the wavelength conversion member 10, a phosphor layer 22 is bonded on the principal surface 1a of the first porous ceramic layer 21 of the obtained laminate to obtain a wavelength conversion member 20.

The heat dissipation layer 23 may be bonded to the first porous ceramic layer 21 after the phosphor layer 22 is previously bonded to the first porous ceramic layer 21.

(3) Wavelength Conversion Member According to Third Embodiment

Figure 3:
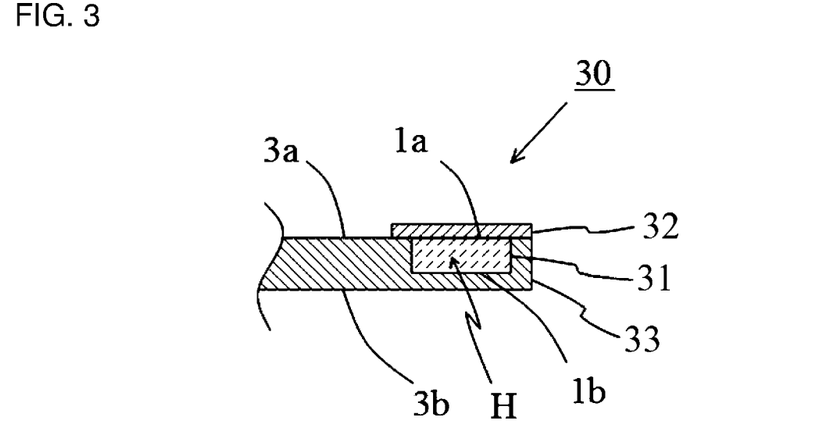
FIG. 3 is a view showing part of a side section of a wavelength conversion member according to a third embodiment of the present invention.

FIG. 3 is a view showing part of a side section of a wavelength conversion member according to a third embodiment of the present invention. A wavelength conversion member 30 according to this embodiment is different from the wavelength conversion member 20 according to the second embodiment in that a ring-shaped recess H concentric with the heat dissipation layer 33 is provided in a principal surface 3a of the heat dissipation layer 33 and the porous ceramic layer 31 is formed within the recess H. The phosphor layer 32 is provided on the principal surface 1a of the porous ceramic layer 31. Specifically, the phosphor layer 32 is formed to cover the principal surface 1a of the porous ceramic layer 31 and part of the phosphor layer 32 is formed on the principal surface 3a of the heat dissipation layer 33. In the case of the wavelength conversion member 30 according to this embodiment, since the phosphor layer 32 is partly formed on top of the heat dissipation layer 33, heat generated in the phosphor layer 32 becomes more likely to be released to the outside.

The wavelength conversion member 30 can be produced in the following manner.

First, in the same manner as the method in the wavelength conversion member 10, a heat dissipation layer 33 is prepared and a recess H is formed in the principal surface 3a of the heat dissipation layer 33 by cutting or other means. Alternatively, in the case of using a dense ceramic layer as the heat dissipation layer 33, green sheets for a dense ceramic layer are fired in a state where they are appropriately laid to provide a recess H, thus obtaining a heat dissipation layer 33 having a recess H formed in the principal surface 3a.

Next, a green sheet for a first porous ceramic layer 31 obtained in the same manner as the method in the wavelength conversion member 10 is cut according to the shape of the recess H in the heat dissipation layer 33 and then laid in the recess H. In doing so, the green sheet for a first porous ceramic layer 31 is preferably appropriately adjusted in size in consideration of contraction during firing (for example, the green sheet is one size larger than the recess H). Thereafter, they are fired, so that a first porous ceramic layer 31 is formed within the recess H of the heat dissipation layer 33.

Furthermore, in the same manner as the method in the wavelength conversion member 10, a phosphor layer 32 is bonded on the principal surface 1a of the first porous ceramic layer 31 to obtain a wavelength conversion member 30.

(4) Wavelength Conversion Member According to Fourth Embodiment

Figure 4:
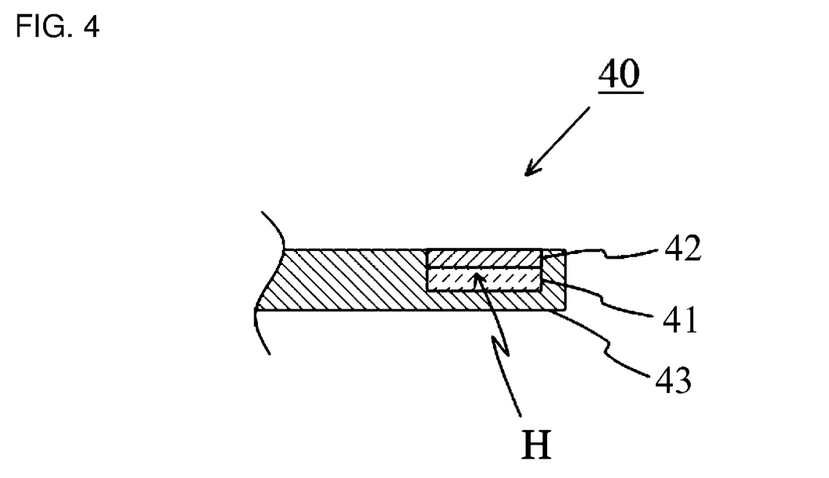
FIG. 4 is a view showing part of a side section of a wavelength conversion member according to a fourth embodiment of the present invention.

FIG. 4 is a view showing part of a side section of a wavelength conversion member according to a fourth embodiment of the present invention. A wavelength conversion member 40 according to this embodiment is different from the wavelength conversion member 30 according to the third embodiment in that the phosphor layer 42 is formed within the recess H. Specifically, the first porous ceramic layer 41 and the phosphor layer 42 are formed, the latter on top of the former, within the recess H formed in the principal surface 3a of the wavelength conversion member 40.

In the case of the wavelength conversion member 40 according to this embodiment, because edges of the phosphor layer 42 make contact with the heat dissipation layer 43, heat generated in the phosphor layer 42 becomes more likely to be released to the outside.

The wavelength conversion member 40 can be produced according to the method for producing the wavelength conversion member 30.

(5) Wavelength Conversion Member According to Fifth Embodiment

Figure 5:
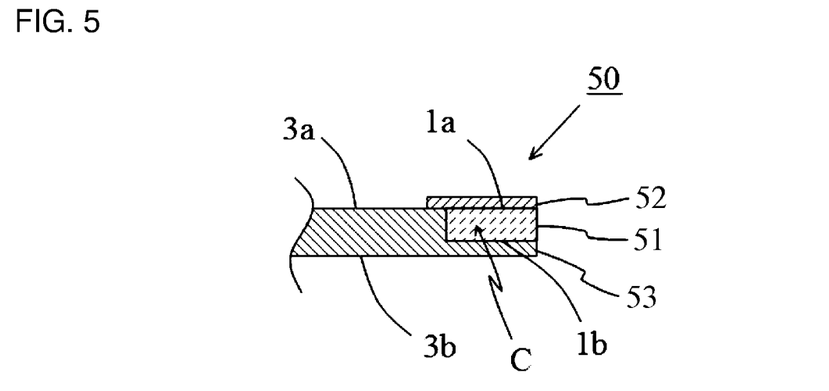
FIG. 5 is a view showing part of a side section of a wavelength conversion member according to a fifth embodiment of the present invention.

FIG. 5 is a view showing part of a side section of a wavelength conversion member according to a fifth embodiment of the present invention. A wavelength conversion member 50 according to this embodiment is different from the wavelength conversion member 30 according to the third embodiment in that a ring-shaped cutaway C concentric with the heat dissipation layer 53 is formed in the principal surface 3a of the heat dissipation layer 53 and the porous ceramic layer 51 is formed within the cutaway C. The phosphor layer 52 is provided on the principal surface 1a of the porous ceramic layer 51. Specifically, the phosphor layer 52 is formed to cover the principal surface 1a of the porous ceramic layer 51 and a portion of the phosphor layer 52 is formed on the principal surface 3a of the heat dissipation layer 53. In the case of the wavelength conversion member 50 according to this embodiment, like the wavelength conversion member 30 according to the third embodiment, since the phosphor layer 52 is partly formed on top of the heat dissipation layer 53, heat generated in the phosphor layer 52 becomes more likely to be released to the outside.

The wavelength conversion member 50 can be produced according to the method for producing the wavelength conversion member 30.

(6) Wavelength Conversion Member According to Sixth Embodiment

Figure 6:
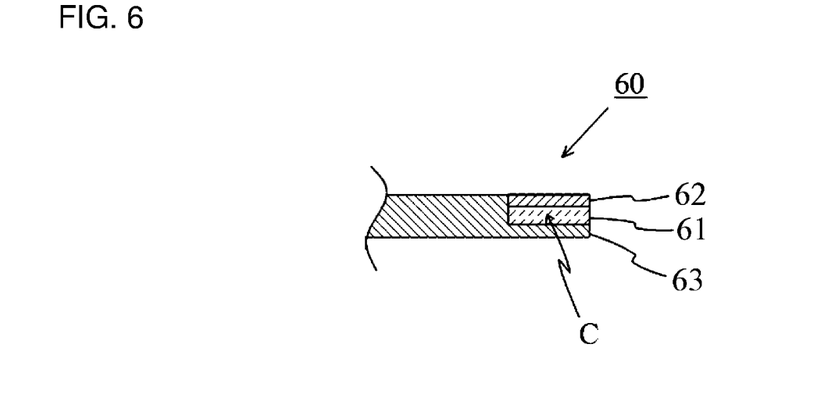
FIG. 6 is a view showing part of a side section of a wavelength conversion member according to a sixth embodiment of the present invention.

FIG. 6 is a view showing part of a side section of a wavelength conversion member according to a sixth embodiment of the present invention. A wavelength conversion member 60 according to this embodiment is different from the wavelength conversion member 50 according to the fifth embodiment in that the phosphor layer 62 is formed within the cutaway C formed in the principal surface 3a of the heat dissipation layer 63. Specifically, the first porous ceramic layer 61 and the phosphor layer 62 are formed, the latter on top of the former, within the cutaway C formed in the principal surface 3a of the wavelength conversion member 60.

In the case of the wavelength conversion member 60 according to this embodiment, because an edge of the phosphor layer 62 makes contact with the heat dissipation layer 63, heat generated in the phosphor layer 62 becomes more likely to be released to the outside.

The wavelength conversion member 60 can be produced according to the method for producing the wavelength conversion member 30.

(7) Wavelength Conversion Member According to Seventh Embodiment

Figure 7:
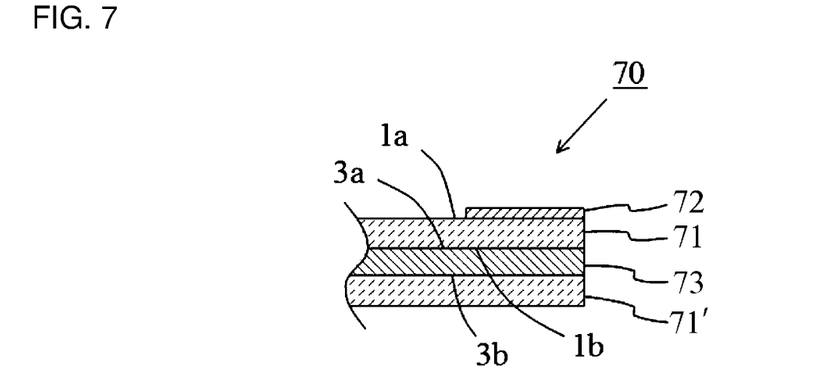
FIG. 7 is a view showing part of a side section of a wavelength conversion member according to a seventh embodiment of the present invention.

FIG. 7 is a view showing part of a side section of a wavelength conversion member according to a seventh embodiment of the present invention. In a wavelength conversion member 70 according to this embodiment, a second porous ceramic layer 71' having substantially the same shape as the first porous ceramic layer 71 is provided on a principal surface 3b of the heat dissipation layer 73. The other structures are the same as in the wavelength conversion member 20 according to the second embodiment.

By providing the second porous ceramic layer 71' on the principal surface 3b of the heat dissipation layer 73, the wavelength conversion member 70 becomes less likely to cause warpage during firing of the green sheet in the course of production as described previously.

With regard to the porosity, the thickness range, and specific examples of the material of the second porous ceramic layer 71', the same as those of the first porous ceramic layer 71 can be selected. From the viewpoint of effectively reducing the problem of warpage of the wavelength conversion member 70 in the firing process during production, the first porous ceramic layer 71 and the second porous ceramic layer 71' are preferably identical in at least one of porosity, thickness, and material and more preferably identical in all of them.

The second porous ceramic layer 71' preferably contains easily sinterable ceramic powder. Thus, the transverse rupture strength of the second porous ceramic layer 71' can be increased, resulting in increased transverse rupture strength of the entire wavelength conversion member. From the viewpoint of effectively reducing the problem of warpage of the wavelength conversion member 70 in the firing process during production, the second porous ceramic layer 71' is preferably identical in content of easily sinterable ceramic powder with the first porous ceramic layer.

The wavelength conversion member 70 can be produced in the following manner.

In the same manner as the method in the wavelength conversion member 10, a green sheet for a first porous ceramic layer 71 and a green sheet for a second porous ceramic layer 71' are obtained. Furthermore, a heat dissipation layer 73 is prepared in the same manner as the method in the wavelength conversion member 20. The green sheet for a first porous ceramic layer 71 is laid on the principal surface 3a of the heat dissipation layer 73, the green sheet for a second porous ceramic layer 71' is laid on the principal surface 3b of the heat dissipation layer 73, and all of them are fired to obtain a laminate in which a first porous ceramic layer 71 and a second porous ceramic layer 71' are bonded to the principal surfaces of the heat dissipation layer 73.

Next, in the same manner as the method in the wavelength conversion member 10, a phosphor layer 72 is bonded on the principal surface 1a of the first porous ceramic layer 71 of the obtained laminate to obtain a wavelength conversion member 70.

(8) Wavelength Conversion Member According to Eighth Embodiment

Figure 8:
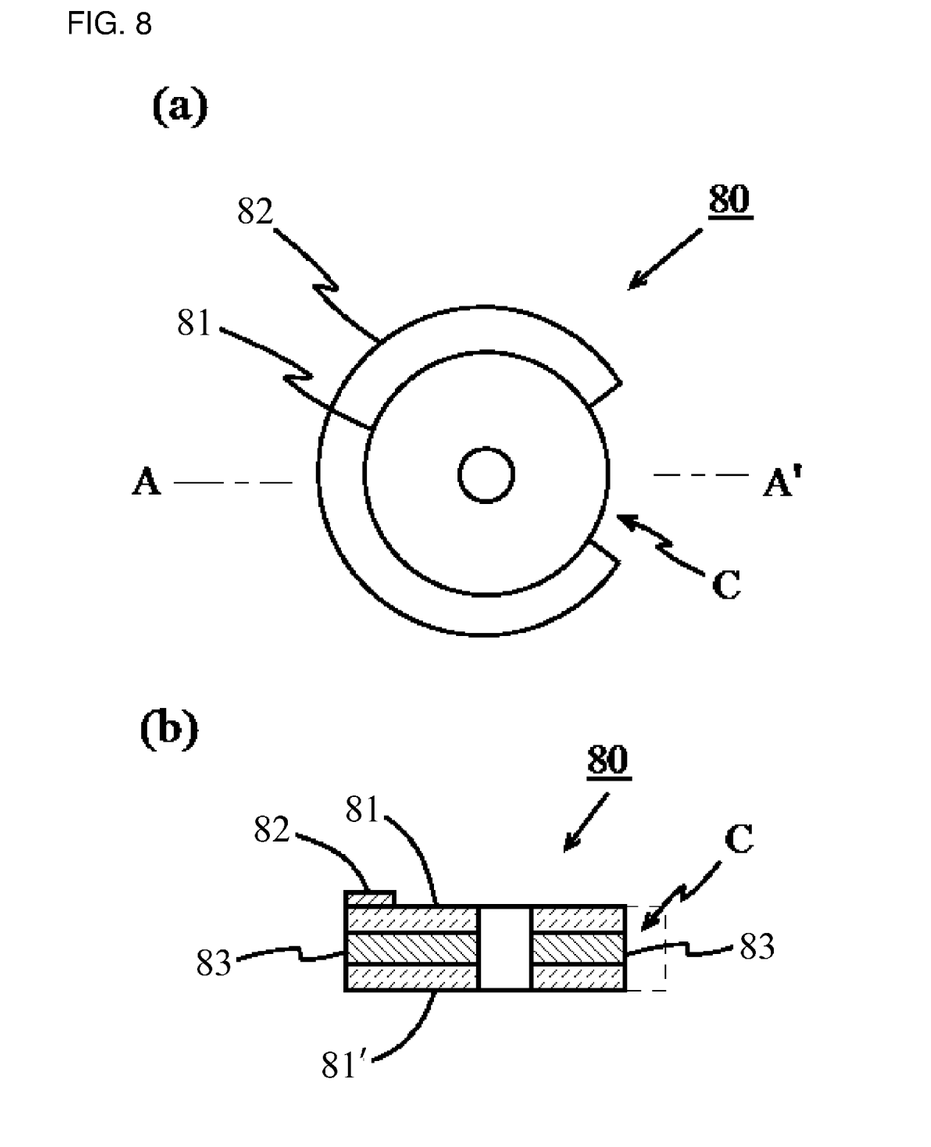

FIG. 8(a) is a plan view showing a wavelength conversion member 80 according to an eighth embodiment of the present invention and FIG. 8(b) is a cross-sectional view taken along the line A-A' in FIG. 8(a). A wavelength conversion member 80 according to this embodiment is different from the wavelength conversion member 70 in that a cutaway C is provided in a portion of a region where the phosphor layer 82 is formed. The makeup of each layer is the same as in the wavelength conversion member 70. In the cutaway C, none of the phosphor layer 82, the first porous ceramic layer 81, the second porous ceramic layer 81', and the heat dissipation layer 83 is formed and a part of a peripheral portion of the wheel is lacking, through which excitation light can be passed. Thus, by the use of the wavelength conversion member 80, a light emitting device can be obtained which enables to appropriately select different uses between the case where excitation light is converted in wavelength in the phosphor layer 82 to extract fluorescence and the case where the excitation light is extracted as it is.

(9) Wavelength Conversion Member According to Ninth Embodiment

Figure 9:
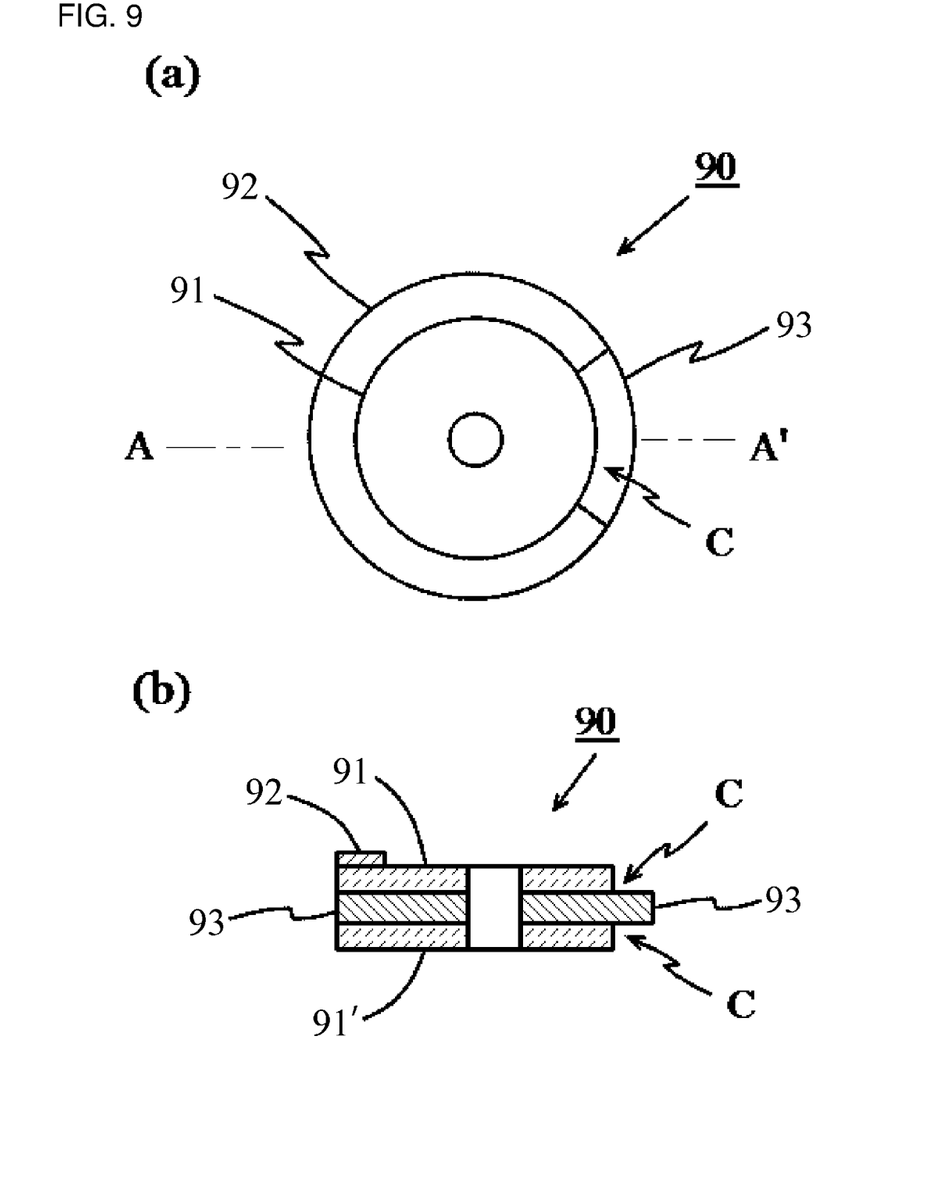

FIG. 9(a) is a plan view showing a wavelength conversion member 90 according to a ninth embodiment of the present invention and FIG. 9(b) is a cross-sectional view taken along the line A-A' in FIG. 9(a). In the wavelength conversion member 90, a cutaway C is provided in a portion of a region where the phosphor layer 92 is formed. The wavelength conversion member 90 is different from the wavelength conversion member 80 in that in the cutaway C the phosphor layer 92, the first porous ceramic layer 91, and the second porous ceramic layer 91' are not formed and the principal surfaces 3a and 3b of the heat dissipation layer 93 are exposed. When in this situation the heat dissipation layer 93 is made of a material capable of transmitting excitation light, such as sapphire, the wavelength conversion member 90, like the wavelength conversion member 80, can pass the excitation light through the cutaway C. In the case of the wavelength conversion member 90, since the heat dissipation layer 93 is formed in the cutaway C, the mass balance of the entire member is good as compared to the wavelength conversion member 80. Therefore, the occurrence of vibrations and wind noises when the wavelength conversion member 90 is rotated at high speed can be reduced. Furthermore, since the principal surfaces 3a and 3b of the heat dissipation layer 93 are partly exposed, heat generated in the phosphor layer 92 is likely to be released to the outside.

(10) Wavelength Conversion Member According to Tenth Embodiment

Figure 10:
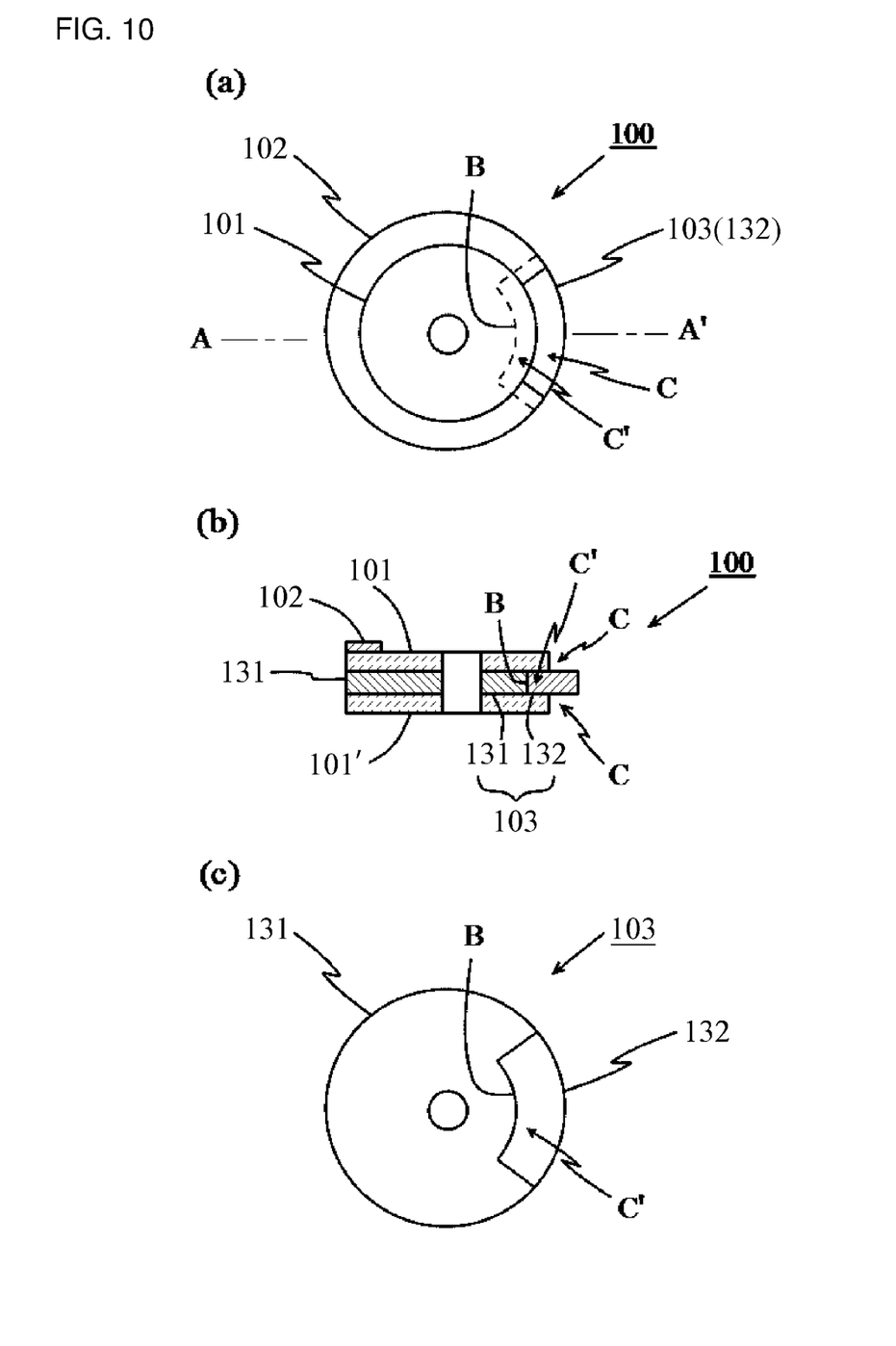

FIG. 10(a) is a plan view showing a wavelength conversion member 100 according to a tenth embodiment of the present invention, FIG. 10(b) is a cross-sectional view taken along the line A-A' in FIG. 10(a), and FIG. 10(c) is a plan view of a heat dissipation layer 103. In the wavelength conversion member 100, like the wavelength conversion member 90, a cutaway C is provided in a portion of a region where the phosphor layer 102 is formed. Furthermore, in the cutaway C, the phosphor layer 102, the first porous ceramic layer 101, and the second porous ceramic layer 101' are not formed and the principal surfaces 3a and 3b of the heat dissipation layer 103 are exposed.

The heat dissipation layer 103 used in the wavelength conversion member 100 is composed of heat dissipation layer pieces 131, 132. Specifically, the heat dissipation layer piece 131 has a cutaway C' and the heat dissipation layer piece 132 having a shape conforming to the cutaway C' is fitted in the cutaway C'. The heat dissipation layer pieces 131, 132 may be bonded together at a boundary B between them with an adhesive.

Because the cutaway C' is one size larger than the cutaway C, the boundary B between the heat dissipation layer pieces 131, 132 of the heat dissipation layer 103 is covered with the first porous ceramic layer 101 and the second porous ceramic layer 101' and only the heat dissipation layer piece 132 is exposed at the cutaway C. Furthermore, the heat dissipation layer pieces 131, 132 are held at the boundary B between the first porous ceramic layer 101 and the second porous ceramic layer 101' and thus secured.

When in this situation the heat dissipation layer piece 132 is made of a material capable of transmitting excitation light, such as sapphire, the wavelength conversion member 100, like the wavelength conversion member 90, can pass the excitation light through the cutaway C. Furthermore, also in the case of the wavelength conversion member 100, since the heat dissipation layer 103 is formed in the cutaway C, the occurrence of vibrations and wind noises when the wavelength conversion member 100 is rotated at high speed can be reduced.

As for the wavelength conversion member 100, part of the heat dissipation layer 103, i.e., only the heat dissipation layer piece 132, has only to be made of a material capable of transmitting excitation light and the other heat dissipation layer piece 131 requires no consideration of excitation light transmission properties. For example, when sapphire is used as the heat dissipation layer piece 132, aluminum oxide approximate in coefficient of thermal expansion to sapphire is preferably used as the heat dissipation layer piece 131. By doing so, the occurrence of stress due to a thermal expansion difference between the heat dissipation layer pieces 131, 132 can be reduced. Furthermore, since a major portion of the heat dissipation layer 103 is made of aluminum oxide which is inexpensive, a reduction in member cost can be achieved.

(Light Emitting Device)

A light emitting device according to the present invention includes the above-described wavelength conversion member (any one of the wavelength conversion members 10 to 70) and a light source capable of irradiating the wavelength conversion member with excitation light. An LED, LD or the like can be used as the light source. Excitation light emanating from the light source is converted in wavelength to fluorescence in the phosphor layer of the wavelength conversion member and the fluorescence is reflected by the first porous ceramic layer and emitted from the same side of the wavelength conversion member as the side to which the excitation light has been applied.

EXAMPLES

Hereinafter, the wavelength conversion member according to the present invention will be described in more detail with reference to examples. However, the present invention is not at all limited to the following examples.

Table 1 shows examples of the present invention and a comparative example

TABLE 1

|  |  |  | Ex. 1 | Ex. 2 | Ex. 3 | Ex. 4 | Comp. Ex. |
|---|---|---|---|---|---|---|---|
|  | Thickness of Phosphor Layer (mm) | | 0.1 | 0.1 | 0.1 | 0.1 | 0.1 |
| Ceramic Layer Laminate | Porous Ceramic Layer | Porosity (%) | 52 | 52 | 47.5 | 40.2 | — |
|  |  | Thickness (mm) | 0.3 | 1 | 0.3 | 0.3 | — |
|  |  | Readily Sinterable Alumina Content (% by mass) | 0 | 0 | 10 | 20 | 0 |
|  |  | Transverse Rupture Strength (MPa) | 54 | — | 85 | 122 | — |
|  | Dense Ceramic Layer | Porosity (%) | 5 | — | 5 | 5 | 5 |
|  |  | Thickness (mm) | 0.8 | — | 0.8 | 0.8 | 0.635 |
|  | Reflectance (%) | | 99.2 | 98.6 | 98.8 | 98.3 | 83.8 |
| Evaluation of Properties | Peak Fluorescence Intensity (a.u.) | | 1290 | 1263 | 1269 | 1251 | 1098 |
|  | Phosphor Layer Temperature (° C.) | | 121 | 145 | 119 | 121 | 141 |

Example 1

(Production of Green Sheet for Porous Ceramic Layer)

Polybutyl methacrylate as a binder, methyl ethyl ketone as a plasticizer, and butyl benzyl phthalate as a solvent were appropriately added to $Al_2O_3$ powder (average particle diameter ($D_{50}$):1 μm) and the mixture was kneaded for 24 hours, thus obtaining a slurry. The obtained slurry was applied onto a polyethylene terephthalate (PET) film using the doctor blade method and dried, thus obtaining a green sheet for a porous ceramic layer (with a thickness of 0.32 mm).

The transverse rupture strength of the porous ceramic layer was measured in the following manner. The green sheet for a porous ceramic layer was subjected to a degreasing treatment at 600° C. for eight hours in the atmosphere and then fired at 1400° C. for five hours, thus obtaining a porous ceramic layer. The obtained porous ceramic layer was measured in terms of transverse rupture strength using a tester (AG-10kNIS manufactured by Shimadzu Corporation).

(Production of Green Sheet for Phosphor Layer)

Raw materials were compounded to provide a glass composition in terms of mole % of 58% $SiO_2$, 6% $Al_2O_3$, 17% $B_2O_3$, 8% $Li_2O$, 8% $Na_2O$, and 3% $K_2O$ and subjected to a melt-quenching process, thus obtaining a film-like glass. The obtained film-like glass was ground using a ball mill to obtain glass powder having an average particle diameter ($D_{50}$) of 1 μm.

The obtained glass powder and YAG ($Y_3Al_5O_{12}$) phosphor powder (average particle diameter ($D_{50}$): 15 μm) were compounded to provide a composition of 30% by volume glass powder and 70% by volume YAG ($Y_3Al_5O_{12}$) phosphor powder and mixed using a vibrational mixer. A binder, a plasticizer, a solvent, and so on were appropriately added to 50 g of the obtained mixture powder and the mixture was kneaded for 24 hours, thus obtaining a slurry. The obtained slurry was applied onto a PET film using the doctor blade method and dried, thus obtaining a green sheet for a phosphor layer (with a thickness of 0.12 mm).

(Production of Wavelength Conversion Member)

The green sheet for a porous ceramic layer and a dense ceramic layer (an $Al_2O_3$ sheet manufactured by MARUWA Co., Ltd. in the product name of HA-96-2 and having a thickness of 0.8 mm and a thermal conductivity of 23 W/m·K) as a heat dissipation layer were laid one on top of another, bonded together by applying a pressure of 10 MPa to them at 100° C. for five minutes using a thermocompression bonder, then subjected to a degreasing treatment at 600° C. for eight hours in the atmosphere, and then fired at 1400° C. for five hours, thus producing a ceramic layer laminate formed of two layers including a porous ceramic layer and a dense ceramic layer.

The respective porosities of the porous ceramic layer and the dense ceramic layer in the ceramic layer laminate were determined by digitizing the reflected electron images of their cross sections and then calculating the proportion of the area of pores in each cross-sectional area. Furthermore, the optical reflectance of the ceramic layer laminate was determined from the average value of reflected light intensities at wavelengths of 400 to 800 nm using UV-2500PC manufactured by Shimadzu Corporation.

Next, the green sheet for a phosphor layer was laid on top of the porous ceramic layer of the ceramic layer laminate and both were bonded together by applying a pressure of 10 MPa to them at 100° C. for five minutes using a thermocompression bonder, then subjected to a degreasing treatment at 500° C. for seven hours in the atmosphere, and then fired at 700° C. for an hour, thus producing a wavelength conversion member.

Example 2

Green sheets for a porous ceramic layer (each with a thickness of 0.26 mm) were produced in the same manner as in Example 1. Four green sheets for a porous ceramic layer were laid one on top of another, bonded together by applying a pressure of 10 MPa to them at 100° C. for five minutes using a thermocompression bonder, then subjected to a degreasing treatment at 600° C. for eight hours in the atmosphere, and then fired at 1400° C. for five hours, thus obtaining a porous ceramic layer. The optical reflectance of the porous ceramic layer was measured in the same manner as in Example 1. The result is shown in Table 1.

The porous ceramic layer and a green sheet for a phosphor layer as obtained in Example 1 were laid one on top of another, bonded together by applying a pressure of 10 MPa to them at 100° C. for five minutes using a thermocompression bonder, then subjected to a degreasing treatment at 500° C. for seven hours in the atmosphere, and then fired at 700° C. for an hour, thus producing a wavelength conversion member.

Example 3

Polybutyl methacrylate as a binder, methyl ethyl ketone as a plasticizer, and butyl benzyl phthalate as a solvent were appropriately added to mixture powder of 90% by volume $Al_2O_3$ powder (average particle diameter ($D_{50}$):1 μm) and 10% by volume easily sinterable alumina powder (Taimicron TM-D manufactured by Taimei Chemicals Co., Ltd.) and the mixture was kneaded for 24 hours, thus obtaining a slurry. The obtained slurry was applied onto a polyethylene terephthalate (PET) film using the doctor blade method and dried, thus obtaining a green sheet for a porous ceramic layer (with a thickness of 0.32 mm).

A wavelength conversion member was produced in the same manner as in Example 1 except that the obtained green sheet for a porous ceramic layer was used.

Example 4

A wavelength conversion member was produced in the same manner as in Example 3 except that in producing a green sheet for a porous ceramic layer, mixture powder of 80% by volume $Al_2O_3$ powder and 20% by volume easily sinterable alumina powder was used.

COMPARATIVE EXAMPLE

A green sheet for a phosphor layer as obtained in Example 1 was bonded to a dense ceramic layer (an $Al_2O_3$ sheet manufactured by MARUWA Co., Ltd. in the product name of HA-96-2 and having a thickness of 0.635 mm) by applying a pressure of 10 MPa to them at 100° C. for five minutes using a thermocompression bonder and, thereafter, they were subjected to a degreasing treatment at 500° C. for seven hours in the atmosphere and then fired at 700° C. for an hour, thus obtaining a wavelength conversion member. The optical reflectance of the dense ceramic layer was measured in the same manner as in Example 1. The result is shown in Table 1.

(Evaluation of Properties)

Figure 11:
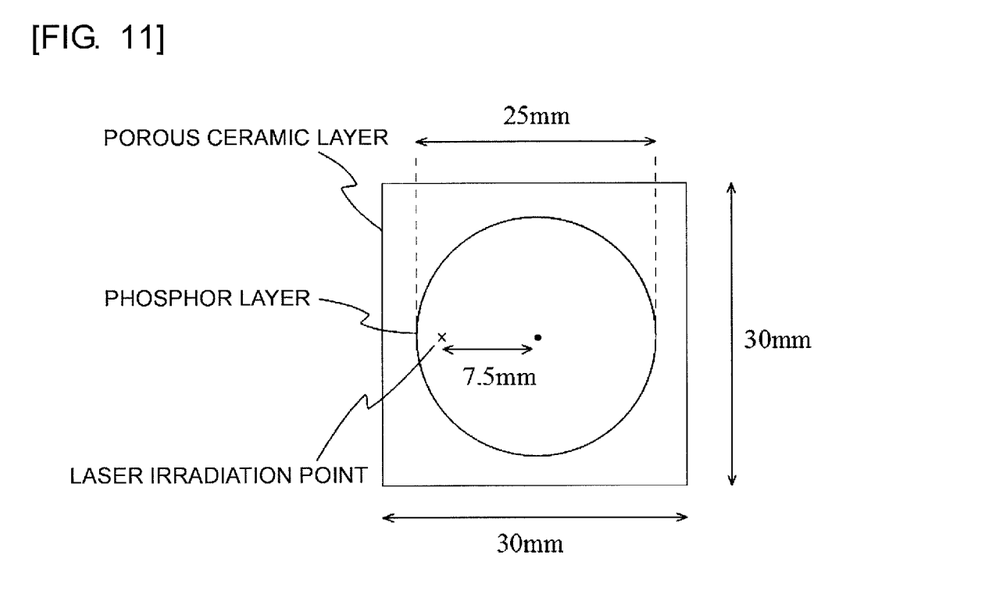
FIG. 11 is a schematic plan view showing a sample of a wavelength conversion member for evaluating properties.

Each of the wavelength conversion members produced in the above manners was measured in terms of peak fluorescence intensity and the surface temperature of the phosphor layer in the following manners. The results are shown in Table 1. For the measurements, a wavelength conversion member having a size shown in FIG. 11 (in which the respective thicknesses of the layers are as shown in Table 1) was used.

The surface of the phosphor layer of the wavelength conversion member rotating at 8000 rpm was irradiated with laser light at power of 30 W from a blue laser light source with a wavelength of 440 nm. The obtained fluorescence was received via an optical fiber by a small spectrometer (USB-4000 manufactured by Ocean Optics Inc.) to obtain luminescence spectra. A peak fluorescence intensity was read from the luminescence spectra. Furthermore, the surface temperature of the phosphor layer was measured using a thermography camera i5 manufactured by FLIR Systems Inc.

As seen from Table 1, the wavelength conversion members in Examples 1 to 4 had peak fluorescence intensities of 1251 (a.u.) or more, whereas the wavelength conversion member in the comparative example had an inferior peak fluorescence intensity of 1098 (a.u.). A comparison between Examples 1 and 2 shows that when a laminate of a porous ceramic layer and a dense ceramic layer was used as a light reflective layer, the optical reflectance increased. In addition, when the dense ceramic layer was laid on the porous ceramic layer, the temperature of the phosphor layer decreased, to which the reduction in the temperature quenching of the phosphor can be attributed. It can be considered that owing to these two factors the wavelength conversion member in Example 1 had a higher peak fluorescence intensity as compared to the wavelength conversion member in Example 2. Furthermore, a comparison among Examples 1, 3, and 4 shows that the incorporation of easily sinterable alumina into the porous ceramic layer improved the transverse rupture strength.

REFERENCE SIGNS LIST 1, 21, 31, 41, 51, 61, 71, 81, 91, 101 first porous ceramic layer
1', 71', 81', 91', 101' second porous ceramic layer
2, 22, 32, 42, 52, 62, 72, 82, 92, 102 phosphor layer
3, 23, 33, 43, 53, 63, 73, 83, 93, 103 heat dissipation layer
10, 20, 30, 40, 50, 60, 70, 80, 90, 100 wavelength conversion member
31, 32, 131, 132 heat dissipation layer piece
H recess
C, C' cutaway
B boundary

The invention claimed is:

1. A wavelength conversion member comprising:
    a first porous ceramic layer having a porosity of 20% by volume or more; and
    a phosphor layer formed on a first principal surface of the first porous ceramic layer.

2. The wavelength conversion member according to claim 1, further comprising a bonding area that bonds the phosphor layer to the first porous ceramic layer; wherein
    the bonding area is created by fusion bonding or through an inorganic bonding layer.

3. The wavelength conversion member according to claim 1, wherein the first porous ceramic layer is made of at least one material selected from aluminum oxide, magnesium oxide, and zirconium oxide.

4. The wavelength conversion member according to claim 1, wherein the phosphor layer includes an inorganic binder and a phosphor dispersed in the inorganic binder.

5. The wavelength conversion member according to claim 1, having a wheel shape.

6. The wavelength conversion member according to claim 1, wherein at least one of the first porous ceramic layer and the second porous ceramic layer includes, at least in part, sintered ceramic powder.

7. The wavelength conversion member according to claim 6, wherein at least one of the first porous ceramic layer and the second porous ceramic layer have a content of sintered ceramic powder of 0.1 to 50% by volume.

8. A light emitting device comprising:
the wavelength conversion member according to claim 1; and
a light source configured to irradiate the phosphor layer of the wavelength conversion member with excitation light.

9. A projector comprising:
the light emitting device according to claim 8, and
projection optics.

10. The wavelength conversion member according to claim 1, wherein a heat dissipation layer is formed on a second principal surface of the first porous ceramic layer located on a side opposite to the first principal surface.

11. The wavelength conversion member according to claim 10, further comprising a dense ceramic heat dissipation layer having a porosity of below 20% by volume.

12. The wavelength conversion member according to claim 11, wherein the dense ceramic heat dissipation layer is made of at least one material selected from aluminum oxide, magnesium oxide, and zirconium oxide.

13. The wavelength conversion member according to claim 10, further comprising a second porous ceramic layer having a porosity of 20% by volume or more formed on a principal first main surface of the heat dissipation layer located on a side opposite to the second principal surface.

14. The wavelength conversion member according to claim 13, wherein the first porous ceramic layer and the second porous ceramic layer are identical in at least one of porosity, thickness, and material.

* * * * *